(12) United States Patent
Obitsu

(10) Patent No.: US 6,650,376 B1
(45) Date of Patent: Nov. 18, 2003

(54) CONTROLLER OF TUNER APPARATUS AND METHOD FOR CONTROLLING POWER SUPPLY TO TUNER OF TUNER APPARATUS

(75) Inventor: Toshiro Obitsu, Inagi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/135,571

(22) Filed: Aug. 18, 1998

(30) Foreign Application Priority Data

Feb. 17, 1998 (JP) .......................................... 10-035178

(51) Int. Cl.$^7$ ................................................ H04N 5/63
(52) U.S. Cl. ....................... 348/730; 348/570; 348/731; 455/184.1
(58) Field of Search ................................ 348/725, 729, 348/553, 570, 730, 731; 455/186.1, 184.1

(56) References Cited

U.S. PATENT DOCUMENTS 3,584,307 A * 6/1971 Hewie .......................... 325/471
4,394,778 A * 7/1983 Ikeguchi et al. ............. 455/182
5,701,599 A * 12/1997 Aihara ...................... 455/186.1
6,169,582 B1 * 1/2001 Lee ............................. 348/552

FOREIGN PATENT DOCUMENTS

| JP | 61-273074 | 12/1986 |
| JP | 5-236394 | 9/1993 |
| JP | 6-105251 | 4/1994 |

* cited by examiner

Primary Examiner—Victor R. Kostak
(74) Attorney, Agent, or Firm—Armstrong, Westerman & Hattori, LLP

(57) ABSTRACT

It is determined, in accordance with a signal supplied by a tuner and indicating a signal reception state of the tuner, whether or not signal reception has been performed normally. Then, power supply to the tuner is stopped when it is determined that signal reception has not been performed normally. Further, it is detected whether or not an antenna has been connected to the tuner apparatus. Then, power supply to the tuner is stopped when it is determined that the antenna has not been connected to the tuner apparatus.

9 Claims, 5 Drawing Sheets

CONTROLLER OF TUNER APPARATUS AND METHOD FOR CONTROLLING POWER SUPPLY TO TUNER OF TUNER APPARATUS

BACKGROUND OF THE INVENTION

1. Field of the Invention

The present invention relates to a controller of a tuner apparatus, and, in particular, to a controller of a tuner apparatus which contains a tuner, such as a liquid-crystal-display television set, a notebook-type personal computer, or the like.

The present invention also relates to a method for controlling power supply to such a tuner of such a tuner apparatus.

Recently, a television set, which is driven by power supplied by a battery, such as a liquid-crystal-display television set, and a notebook-type personal computer which is driven by power supplied by a battery and displays a television picture on a liquid crystal display, which is contained in the television set, have been developed. Such an apparatus is driven by a battery and a driving time period (a time period during which the apparatus can be driven by power supplied by a battery) thereof is limited. Accordingly, it is demanded to reduce power consumption in such an apparatus so as to elongate the driving time period of the apparatus.

2. Description of the Related Art

An apparatus which contains a television tuner and in which power consumption is reduced is disclosed in Japanese Laid-Open Patent Application No. 61-273074 or Japanese Laid-Open Patent Application No. 5-236394.

In Japanese Laid-Open Patent Application No. 61-273074, a magnetic picture-recording-and-reproducing apparatus with a television set is disclosed, which includes a television tuner portion for receiving a television broadcast, a VTR portion for recording a video signal and reproducing a picture, a television monitor portion for displaying a picture, a power supply portion for supplying power to the respective portions via a main switch, and a sub-switch for stopping power supply to the television tuner portion in a reproduction mode, and in which apparatus power consumption is effectively reduced.

Further, in Japanese Laid-Open Patent Application No. 5-236394, a television set is disclosed, which includes an external input terminal through which a video signal is input externally, a tuner circuit, an input switching circuit for switching a video signal between a video signal input through the external input terminal and the video signal input from the tuner circuit, a video-signal processing circuit, a picture tube for displaying a picture signal, a video-signal presence/absence detecting circuit for detecting presence and absence of a video signal, and a control circuit for turning off a power supply circuit for supplying power to a picture-tube body when absence of the video input signal is detected, which apparatus prevents turning off of power supply from being forgotten.

However, In the magnetic picture-recording-and-reproducing apparatus with a television set disclosed in Japanese Laid-Open Patent Application No. 61-273074, in a mode other than the reproduction mode of the VTR portion, power is supplied to the television tuner portion, even in a condition where an antenna is not connected with the television tuner portion or in a condition where the antenna is connected with the television tuner and only a faint signal is received. As a result, although it is not possible to substantially watch a television picture, a meaningless picture is displayed, and power is consumed wastefully in the television tuner portion.

In the television set disclosed in Japanese Laid-Open Patent Application No. 5-236394, as mentioned above, the power supply circuit for the picture tube body is turned off when absence of the video signal is detected. However, even in a condition where an antenna is not connected with the tuner circuit or in a condition where the antenna is connected with the tuner circuit and only a faint signal is received, absence of the video signal is not detected in the video-signal presence/absence detecting circuit because a faint video signal component is input. As a result, the power supply circuit for the picture tube body is not turned off, and power is wastefully consumed.

SUMMARY OF THE INVENTION

The present invention has been devised in consideration of the above-mentioned problems, and an object of the present invention is to provide a tuner apparatus and a method for controlling power supply to a tuner of such a tuner apparatus, in which a power supply to a television tuner is stopped either in a condition where an antenna is not connected with a tuner circuit or in a condition where the antenna is connected with the tuner circuit and only a faint signal is received, wasteful power consumption is eliminated, and thus, a driving time period of the apparatus can be elongated.

A tuner apparatus, according to the present invention, containing a tuner, comprises:

signal reception determining means for determining, in accordance with a signal supplied by the tuner and indicating a signal reception condition, whether or not signal reception has been performed normally; and power supply stopping means for stopping power supply to the tuner when the signal determining means determines that signal reception has not been performed normally.

Thus, it is determined, in accordance with the signal supplied by the tuner and indicating the signal reception condition, whether or not signal reception has been performed normally, and power supply to the tuner is stopped when it is determined that signal reception has not been performed normally. As a result, it can be prevented that a meaningless picture is displayed and power is consumed wastefully.

The tuner apparatus may further comprise antenna connection detecting means for detecting whether or not an antenna has been connected to the tuner apparatus, wherein the power supply stopping means stops power supply to the tuner when the antenna connection detecting means determines that the antenna has not been connected to the tuner apparatus.

Thus, it is determined, in accordance with the signal supplied by the tuner and indicating the signal reception condition, whether or not signal reception has been performed normally, and power supply to the tuner is stopped when it is determined that signal reception has not been performed normally. Further, it is detected whether or not the antenna has been connected to the tuner apparatus, and power supply to the tuner is stopped when it is determined that the antenna has not been connected to the tuner apparatus. As a result, it can be prevented that a meaningless picture is displayed and power is consumed wastefully.

A tuner apparatus, according to another aspect of the present invention, containing a tuner, comprises:

antenna connection detecting means for detecting whether or not an antenna has been connected to the tuner apparatus; and power supply stopping means for stopping power supply to the tuner when the antenna connection detecting means determines that the antenna has not been connected to the tuner apparatus.

Thus, it is detected whether or not the antenna has been connected to the tuner apparatus, and power supply to the tuner is stopped when it is determined that the antenna has not been connected to the tuner apparatus. As a result, it can be prevented that a meaningless picture is displayed and power is consumed wastefully.

The power supply may comprise power supply by a battery.

Thus, it is determined, in accordance with the signal supplied by the tuner and indicating the signal reception condition, whether or not signal reception has been performed normally, and power supply to the tuner is stopped when it is determined that signal reception has not been performed normally. Further, it is detected whether or not the antenna has been connected to the tuner apparatus, and power supply to the tuner is stopped when it is determined that the antenna has not been connected to the tuner apparatus. As a result, it can be prevented that a meaningless picture is displayed and power is consumed wastefully. Thereby, it is possible to elongate the life of the battery.

The tuner apparatus may comprise a notebook-type personal computer.

In this notebook-type personal computer, wasteful power consumption can be prevented, and the life of the battery can be elongated.

The signal supplied by the tuner and indicating the signal reception condition may comprise an automatic fine tuning signal which shows an S-curve characteristic.

Thereby, it is possible to effectively determine whether or not the normal signal reception has been performed.

The antenna connection detecting means may detect whether or not the antenna has been connected to the tuner apparatus, as a result of detecting whether or not a plug of the antenna has been loaded into a jack of the tuner apparatus.

Other objects and further features of the present invention will become more apparent from the following detailed description when read in conjunction with the accompanying drawings.

DETAILED DESCRIPTIONS OF THE PREFERRED EMBODIMENT

Figure 1:
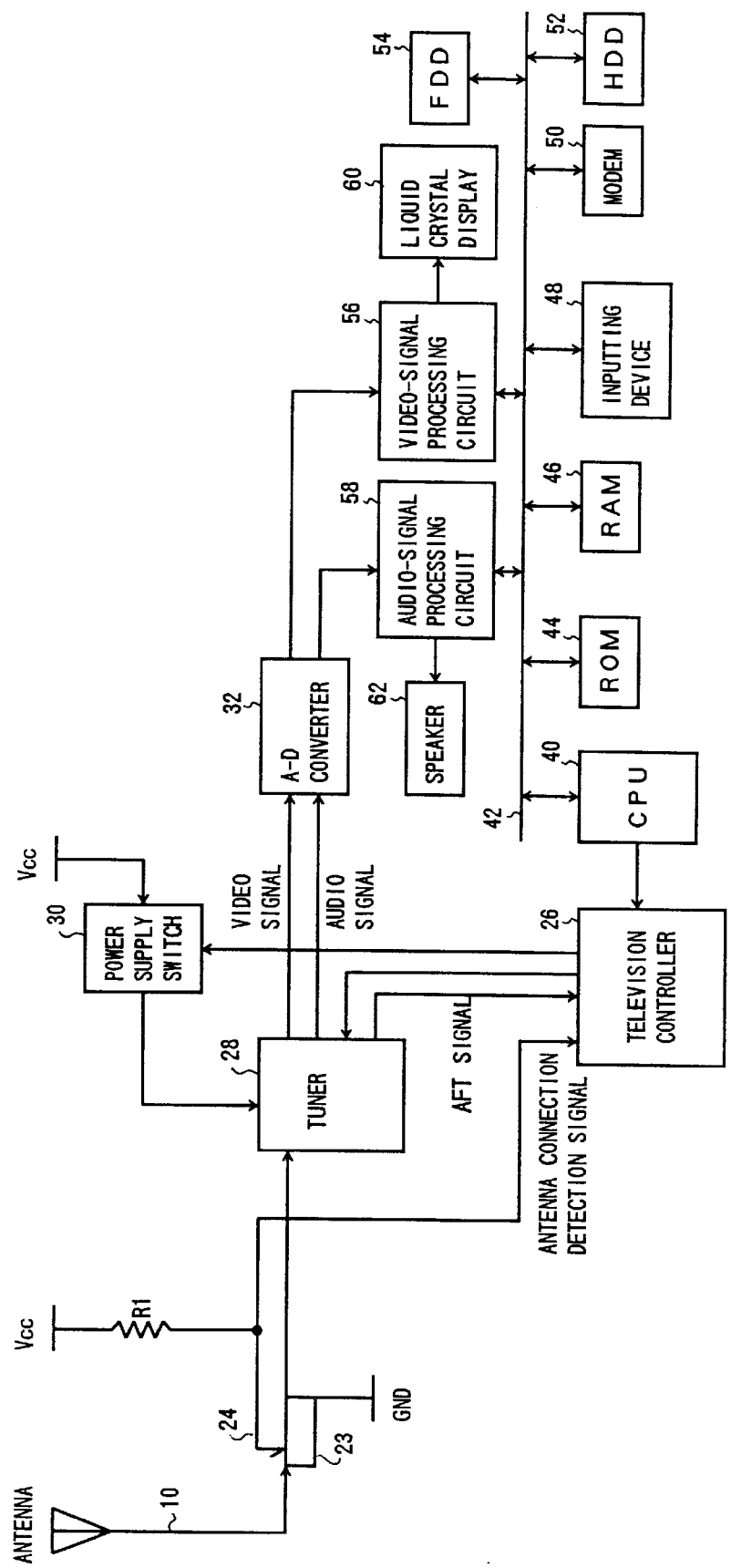
FIG. 1 shows a block diagram of a notebook-type personal computer in one embodiment of the present invention.
Figure 2:
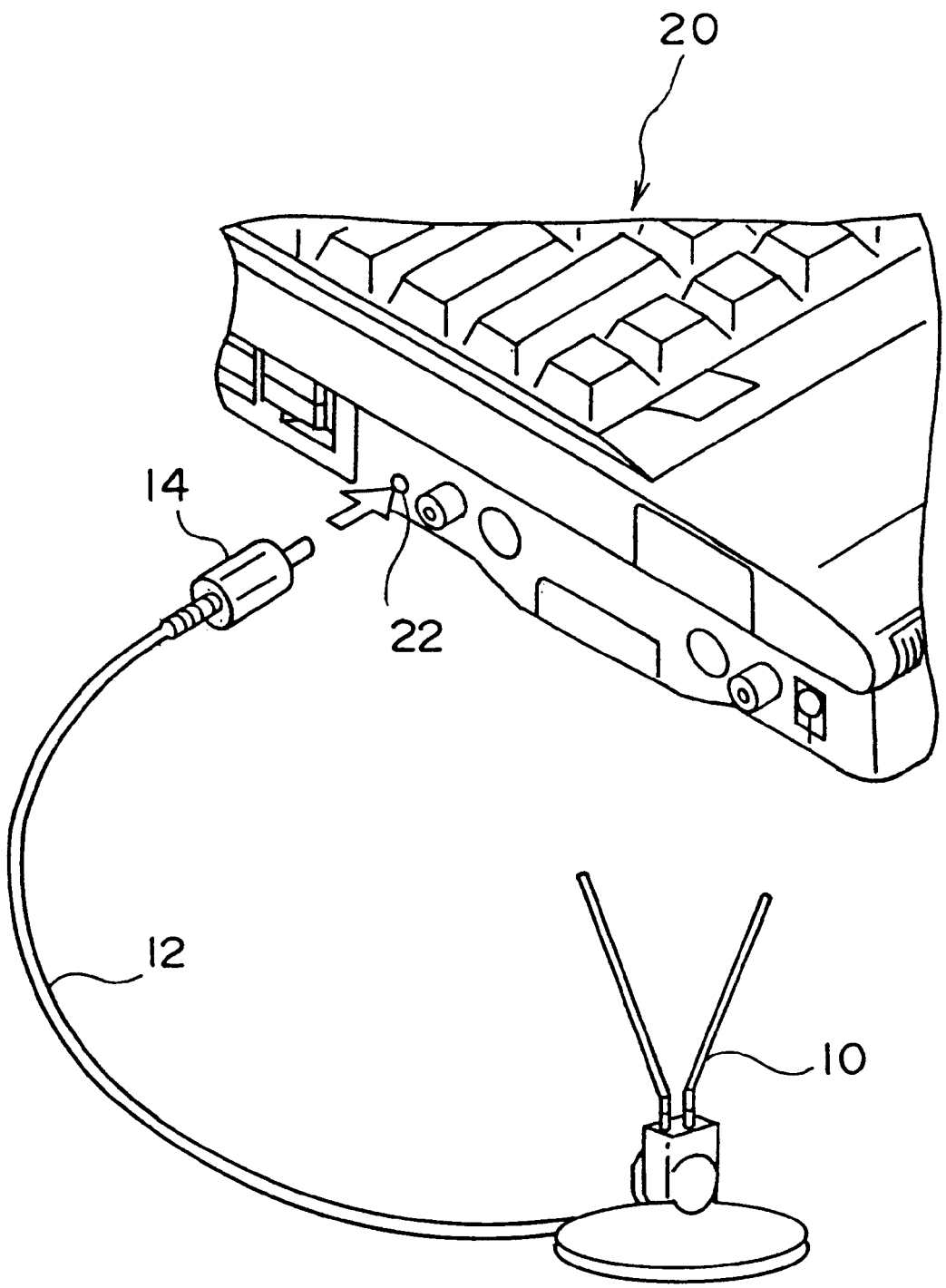
FIG. 2 is an exterior perspective view showing a connection between an antenna and the notebook-type personal computer.

FIG. 1 shows a block diagram of a notebook-type personal computer in one embodiment of a tuner apparatus according to the present invention. FIG. 2 is an exterior perspective view showing a connection between an antenna 10 and the notebook-type personal computer 20. This notebook-type personal computer 20 is driven by power supplied by a battery. In FIG. 2, a plug 14 of an antenna cable 12 of the antenna 10 for a television set can be loaded into and withdrawn out from a jack 22 of the notebook-type personal computer 20. The antenna 10 is used in a condition in which the plug 14 has been loaded into the jack 22.

As shown in FIG. 1, a lead terminal 24 provided in the jack 22 is separated from a ground terminal 23 of the jack 22 in a condition where the plug 14 has been withdrawn out from the jack 22. The lead terminal 24 has a power source voltage Vcc applied thereto via a resistor R1 and is connected to a television controller 26. In the condition where the plug 14 has been withdrawn out from the jack 22, an antenna connection detection signal of a high level is supplied to the television controller 26.

In a condition where the plug 14 has been loaded into the jack 22, the lead terminal 24 is connected to the ground terminal 23 through the plug 14, and the antenna connection detection signal of a low level is supplied to the television controller 26. In this condition, a signal received through the antenna 10 is supplied to a tuner 28.

The tuner 28 has the power supply voltage Vcc applied thereto via a power supply switch 30. A video signal and an audio signal obtained as a result of demodulation performed by the tuner 28 on the received signal are supplied to an A-D converter 32. The tuner 28 supplies an AFT (Automatic Fine Tuning) signal showing an S-curve characteristic to the television controller 26.

Figure 3:
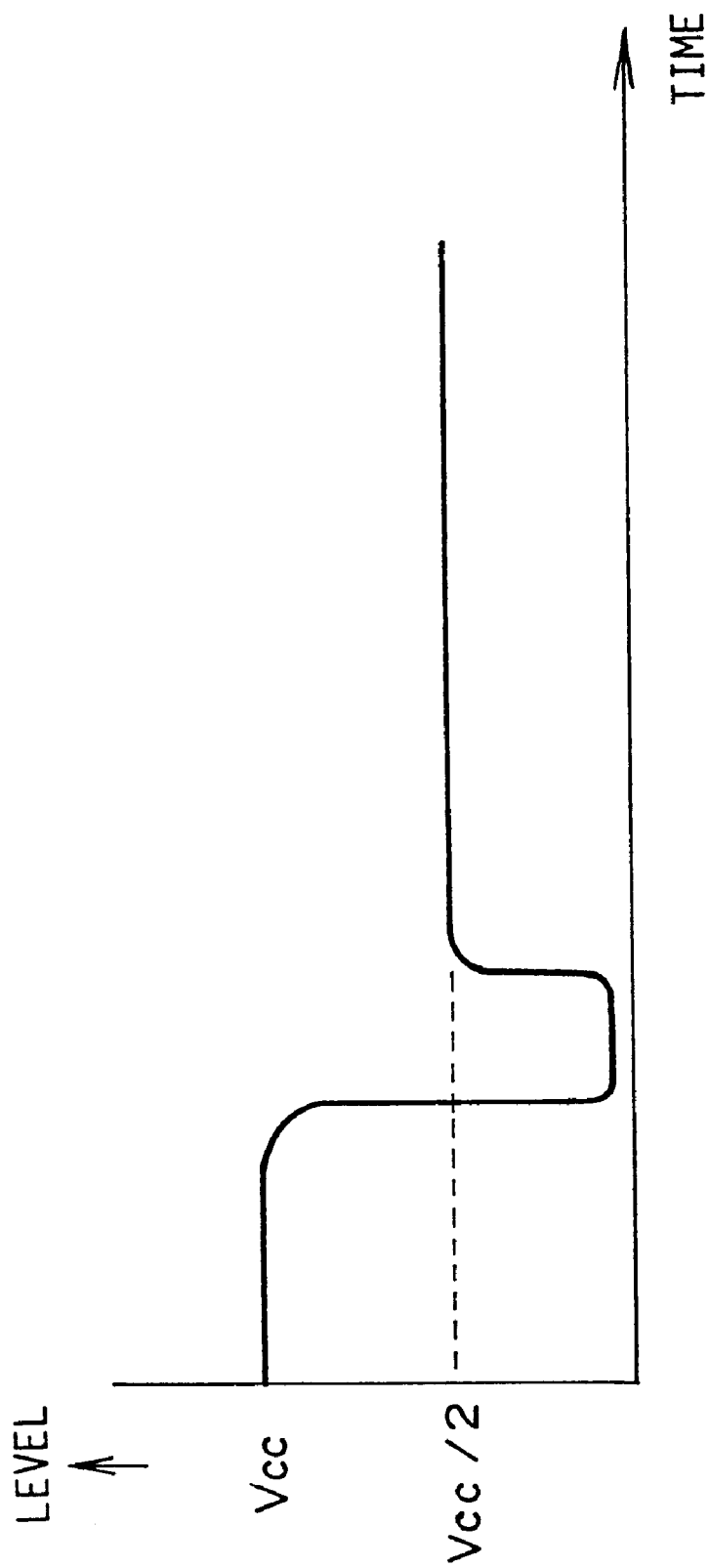
FIG. 3 shows a waveform of an S-curve characteristic.

The S-curve characteristic will now be described. A local oscillation frequency of the tuner 28 is set to a frequency determined by a PLL circuit. However, there is a case where the frequency of a signal transmitted is shifted depending on a signal reception condition and depending on a broadcasting station. Therefore, in order to normally receive such a signal transmitted, it is necessary to change the local oscillation frequency in accordance with the frequency of the signal transmitted. An AFT is a loop for controlling this local oscillation frequency. The AFT outputs the AFT signal of the voltage of Vcc/2 when the frequency of the signal received through the antenna 10 agrees with the local oscillation frequency; of the voltage lower than Vcc/2 when the local oscillation frequency is higher than the frequency of the signal received through the antenna 10; and of the voltage higher than Vcc/2 when the local oscillation frequency is lower than the frequency of the signal received through the antenna 10. Therefore, at a time of tuning, the AFT signal shows the S-curve characteristic as shown in FIG. 3.

Based on instructions from a CPU (Central Processing Unit) 40, the television controller 26 supplies a frequency setting signal to the tuner 28 so as to select a channel. Further, in accordance with the antenna connection detection signal supplied from the lead terminal 24 of the jack 22 and the AFT signal supplied from the tuner 28, the television controller 26 controls open/close of the power supply switch 30.

The CPU 40 is connected to a bus line 42. Further, a ROM 44, a RAM 46, an inputting device 48 such as a keyboard, a pointing device or the like, a modem 50, a hard disk device (HDD) 52, a flexible disk device (FDD) 54, a video-signal processing circuit 56, an audio-signal processing circuit 58, and so forth, are connected to the bus line 42. Operations of these circuits and devices, which are connected to the bus line 42, are controlled by a program executed by the CPU 40.

The video signal, which has been converted into a digital signal through the A-D converter 32, is supplied to the video-signal processing circuit 56, and a picture is displayed on a liquid crystal display 60. The audio signal, which has been converted into a digital signal through the A-D converter 32, is supplied to the audio-signal processing circuit 58, and a sound is generated by a speaker 62.

Figure 4:
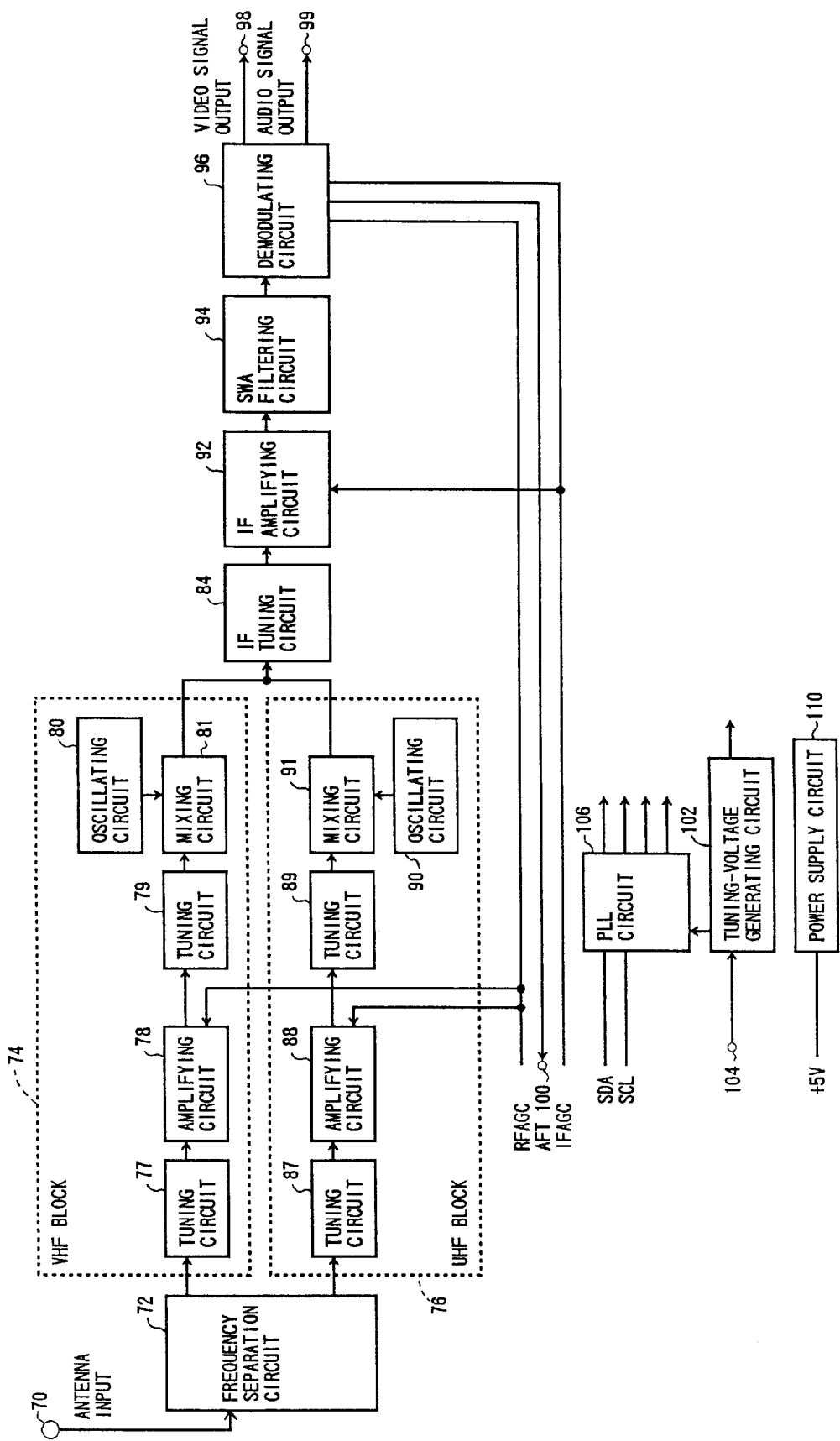
FIG. 4 shows a block diagram of a tuner shown in FIG. 1.

FIG. 4 shows a block diagram of the tuner 28 in the embodiment of the present invention. In the figure, when the plug 14 of the antenna 10 is loaded into the jack 22 of the personal computer 20, the signal received through the antenna 10 is supplied to a terminal 70. This received signal is separated into a signal of a VHF frequency band and a signal of a UHF frequency band through a frequency separation circuit 72. The signal of the VHF frequency band is supplied to a tuning circuit 77 of a VHF block 74. The signal of the UHF frequency band is supplied to a tuning circuit 87 of a UHF block 76.

When VHF is selected, the tuning circuit 77 of the VHF block 74 tunes and selects the signal, of the VHF frequency band, of a frequency in accordance with a tuning voltage supplied from a tuning-voltage generating circuit 102. The thus-obtained signal is supplied to an amplifying circuit 78. The signal which has been amplified through the amplifying circuit 78 is supplied to a mixing circuit 81 via a tuning circuit 79. An oscillating circuit 80 generates a local oscillation signal of a frequency based on a frequency signal supplied from a PLL circuit 106. The thus-generated local oscillation signal is supplied to the mixing circuit 81. The mixing circuit 81 mixes the signal supplied from the tuning circuit 79 and the local oscillation signal, and generates an intermediate frequency (IF) signal. The intermediate frequency (IF) signal is supplied to an IF tuning circuit 84.

When UHF is selected, the tuning circuit 87 of the VHF block 76 tunes and selects the signal, of the UHF frequency band, of a frequency in accordance with a tuning voltage supplied from the tuning-voltage generating circuit 102. The thus-obtained signal is supplied to an amplifying circuit 88. The signal which has been amplified through the amplifying circuit 88 is supplied to a mixing circuit 91 via a tuning circuit 89. An oscillating circuit 90 generates a local oscillation signal of a frequency based on a frequency signal supplied from the PLL circuit 106. The thus-generated local oscillation signal is supplied to the mixing circuit 91. The mixing circuit 91 mixes the signal supplied from the tuning circuit 89 and the local oscillation signal, and generates an intermediate frequency (IF) signal. The intermediate frequency (IF) signal is supplied to the IF tuning circuit 84.

The IF tuning circuit 84 tunes and selects the intermediate frequency signal supplied from the mixing circuit 81 or 91, and the thus-obtained signal is supplied to an IF amplifying circuit 92. The intermediate frequency signal, which has been amplified through the amplifying circuit 92, is supplied to an SWA filtering circuit 94, which removes unnecessary frequency components from the intermediate frequency signal. The thus-obtained intermediate frequency signal is provided to a demodulating circuit 96, which demodulates the video signal and the audio signal from the intermediate frequency signal. The thus-obtained video signal is output via a terminal 98 and the thus-obtained audio signal is output via a terminal 99. Further, an RFAGC (Radio-Frequency Automatic Gain Control) signal obtained from the demodulating circuit 96 is supplied to the amplifying circuits 78 and 88, and gain control of the amplifying circuits 78 and 88 is performed. An IFAGC (Intermediate-Frequency Automatic Gain Control) signal obtained from the demodulating circuit 96 is supplied to the IF amplifying circuit 92, and gain control of the amplifying circuit 92 is performed. An AFT signal obtained from the demodulating circuit 96 is output via a terminal 100.

The tuning-voltage generating circuit 102 has the frequency setting signal for selecting a channel supplied thereto via a terminal 104 from the television controller 26. The tuning-voltage generating circuit 102 generates the tuning voltage which is in accordance with the above-mentioned frequency setting signal, and supplies the generated tuning voltage to the tuning circuits 78, 88 and the PLL circuit 106. The PLL circuit 106 has data SDA for the frequency setting and a clock signal SCL supplied thereto from the television controller 26. The PLL circuit 106 generates the frequency signal which is based on the data SDA, clock signal SCL and the above-mentioned tuning voltage, and supplies the generated frequency signal and signals, obtained as a result of frequency dividing being performed on the above-mentioned frequency signal, to the oscillating circuits 80, 90, demodulating circuit 96 and so forth. Further a power supply circuit 110 supplies power to the respective circuits of the tuner 28 under control by the television controller 26.

Figure 5:
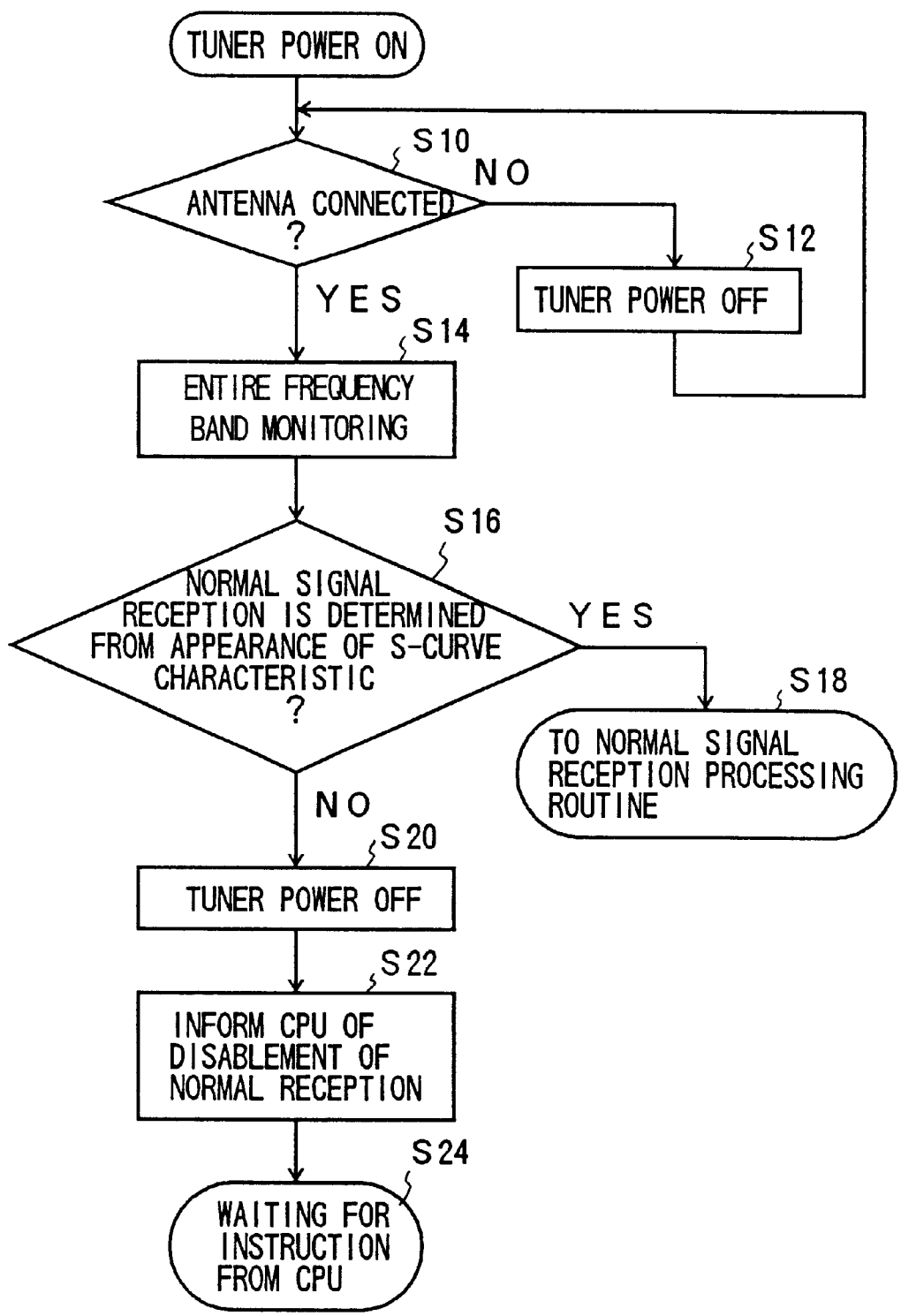
FIG. 5 shows a flowchart of control processing executed by a television controller shown in FIG. 1.

The television controller 26 comprises one chip of a microprocessor. FIG. 5 shows a flowchart of control processing executed by the television controller 26 in the embodiment of the present invention. The television controller 26 starts execution of this processing when power supply to the power supply circuit 110 of the tuner 28 is started as a result of a control signal being supplied from the television controller 26 to the power supply switch 30 such that the power supply switch 30 is closed and the power supply to the power supply circuit 110 of the tuner 28 is started. The television controller 26 supplies the above-mentioned control signal for closing the power supply switch 30 in accordance with instructions supplied from the CPU 40. In a step S10, it is determined, in accordance with whether the antenna connection detection signal supplied from the lead terminal 24 of the jack 22 to the television controller 26 is at the low level or the high level, whether or not the plug 14 of the antenna 10 has been loaded into the jack 22 and the antenna 10 has been connected to the personal computer 20.

When it is determined in the step S10 that the plug 14 of the antenna 10 has not been loaded into the jack 22 and thus the antenna 10 has not been connected to the personal computer 20, the control signal is supplied from the television controller 26 to the power supply switch 30 such that the power supply switch 30 is opened and the power supply to the power supply circuit 110 of the tuner 28 via the power supply switch 30 is stopped in a step S12. Then, the steps S10 and S12 are repeated until it is determined that the antenna 10 has been connected to the personal computer 20. When it is determined that the plug 14 of the antenna 10 has been loaded into the jack 22 of the personal computer 20 and thus the antenna 10 has been connected to the personal computer 20, the entire frequency band through VHF and UHF is scanned and monitored by the tuner 28 so that a channel through which a signal can be received is determined, in a step S14. As a result, the tuner 28 generates the AFT signal.

Then, in a step S16, by using the level of the AFT signal supplied from the tuner 28 to the television controller 26, it is determined whether or not the AFT signal has come to have the level of Vcc/2 as a result of showing the S-curve characteristic such as that shown in FIG. 3, and a signal from any station has been normally received. When it is determined in the step S16 that a signal from any station has been normally received, an ordinary signal-reception-processing routine is performed in a step S18.

When it is determined in the step S16 that a signal from any station has not been normally received, the control signal is supplied from the television controller 26 to the power supply switch 30 such that the power supply switch 30 is opened and the power supply to the power supply circuit 110 of the tuner 28 via the power supply switch 30 is stopped in a step S20. Then, the television controller 26 informs the CPU 40 that signal reception could not be normally performed, in a step S22. Then, the television controller 26 enters a condition in which the television controller 26 is waiting for the instructions supplied from the CPU 40, in a step S24.

Thus, in the embodiment of the present invention, either in the case where the antenna 10 has not been connected to the personal computer 20 or the case where a signal from any station has been normally received, power supply to the power supply circuit 110 of the tuner 28 is stopped. Thereby, power consumption can be effectively reduced and the driving time period of the personal computer 20 can be elongated.

The operations of the steps S14 and S16 are signal-reception determining operations, and performed by using the tuner 28. Each of the operations of the steps S12 and S20 is a power-supply stopping operation and is performed by using the power supply switch 30. The operation of the step S10 is an antenna-connection detecting operation, and is performed by using the ground terminal 23 and lead terminal 24 of the jack 22.

When the antenna 10 has not been connected to the personal computer 20, a signal from any station has not been normally received generally. Accordingly, it is possible to determine in the step S16 that the antenna 10 has not been connected to the personal computer 20. Therefore, it is possible to omit the steps S10 and S12 and omit the lead terminal 24 so as to simplify the operations performed by the television controller 26 and the arrangement of the jack 22.

The present invention is not limited to the above-described embodiment, and variations and modifications may be made without departing from the scope of the present invention.

For example, although the embodiment in which the notebook-type personal computer is used has been described, the notebook-type personal computer can be replaced by another apparatus driven by a battery such as a liquid-crystal-display television set. Further, the tuner for the television set can be replaced by a tuner for a radio set.

What is claimed is:

1. A controller of a tuner apparatus comprising:
   a signal-reception determining unit determining, in accordance with a signal supplied by a tuner and indicating a signal reception condition, whether or not signal reception has been performing normally; and
   a power-supply stopping unit stopping power supply to said tuner when said signal determining unit determines that signal reception has not been performing normally;
   wherein the signal supplied by said tuner and indicating the signal reception condition comprises an automatic fine tuning signal which shows an S-curve characteristic when signal reception is performing normally, and causes the power-supply stopping unit to stop power supply to said tuner when an S-curve characteristic is not shown indicating that signal reception has not been performing normally.

2. The controller of the tuner apparatus, according to claim 1, further comprising an antenna-connection detecting unit for detecting whether or not an antenna has been connected to said tuner apparatus,
   wherein said power-supply stopping unit stops power supply to said tuner when it is determined through said antenna-connection detecting unit that the antenna has not been connected to said tuner apparatus.

3. The controller of the tuner apparatus, according to claim 1, wherein the power supply comprises power supply by a battery.

4. The controller of the tuner apparatus according to claim 1, wherein said tuner apparatus comprises a notebook-type personal computer.

5. The controller of the tuner apparatus according to claim 2, wherein said antenna connection detecting unit is used for detecting whether or not the antenna has been connected to said tuner apparatus, as a result of detecting whether or not a plug of the antenna has been loaded into a jack of said tuner apparatus.

6. A controller of a tuner apparatus comprising:
   a power supply switch causing power to be supplied to a tuner; and
   a control unit determining, in accordance with a signal supplied by said tuner and indicating a signal reception condition, whether or not signal reception has been performing normally, and controlling said power supply switch so as to cause power not to be supplied to said tuner when it is determined that signal reception has not been performing normally;
   wherein the signal supplied by said tuner and indicating the signal reception condition comprises an automatic fine tuning signal which shows an S-curve characteristic when signal reception is performing normally, and causes the power-supply stopping unit to stop power supply to said tuner when an S-curve characteristic is not shown indicating that signal reception has not been performing normally.

7. The controller of the tuner apparatus, according to claim 6, further comprising an antenna connection portion through which an antenna is connected to said tuner apparatus, said control unit detecting, in accordance with a signal supplied from said antenna connection portion, whether or not said antenna has been connected to said tuner apparatus through said antenna connection portion, and controlling said power supply switch so as to cause power not to be supplied to said tuner when it is determined that said antenna has not been connected to said tuner apparatus.

8. A method for controlling power supply to a tuner of a tuner apparatus, comprising the steps of:
   a) determining, in accordance with a signal supplied by said tuner and indicating a signal reception condition, whether or not signal reception has been performing normally; and
   b) stopping power supply to said tuner when it is determined in said step a) that signal reception has not been performing normally;
   wherein the signal supplied by said tuner and indicating the signal reception condition comprises an automatic fine tuning signal which shows an S-curve characteristic when signal reception is performing normally, and causes the power-supply stopping unit to stop power supply to said tuner when an S-curve characteristic is not shown indicating that signal reception has not been performing normally.

9. The method according to claim 8, further comprising the steps of:
   c) detecting whether or not an antenna has been connected to said tuner apparatus; and
   d) stopping power supply to said tuner when it is determined in said step c) that the antenna has not been connected to said tuner apparatus.

* * * * *